(12) United States Patent
Lin et al.

(10) Patent No.: US 9,728,844 B2
(45) Date of Patent: Aug. 8, 2017

(54) HIGH-GAIN DIGITALLY TUNED ANTENNA SYSTEM WITH MODIFIED SWEPT-BACK FRACTAL (MSBF) BLADE

(71) Applicant: SENSOR SYSTEMS, INC., Chatsworth, CA (US)

(72) Inventors: Zhen Biao Lin, West Hills, CA (US); Jack J. Q. Lin, Northridge, CA (US); Seymour Robin, Woodland Hills, CA (US)

(73) Assignee: SENSOR SYSTEMS, INC., Chatsworth, CA (US)

( * ) Notice: Subject to any disclaimer, the term of this patent is extended or adjusted under 35 U.S.C. 154(b) by 204 days.

(21) Appl. No.: 14/301,743

(22) Filed: Jun. 11, 2014

(65) Prior Publication Data
US 2015/0035710 A1 Feb. 5, 2015

Related U.S. Application Data

(60) Provisional application No. 61/860,717, filed on Jul. 31, 2013.

(51) Int. Cl.
| | |
|---|---|
| *H01Q 9/00* | (2006.01) |
| *H01Q 1/28* | (2006.01) |
| *H01Q 1/36* | (2006.01) |
| *H01Q 23/00* | (2006.01) |
| *H01Q 5/335* | (2015.01) |
| *H03H 7/38* | (2006.01) |

(52) U.S. Cl.
CPC ............... *H01Q 1/283* (2013.01); *H01Q 1/36* (2013.01); *H01Q 5/335* (2015.01); *H01Q 23/00* (2013.01); *H03H 7/38* (2013.01)

(58) Field of Classification Search
CPC .......... H01Q 1/283; H01Q 1/36; H01Q 5/335; H01Q 23/00; H03H 7/38
See application file for complete search history.

(56) References Cited

U.S. PATENT DOCUMENTS

| | | | | | |
|---|---|---|---|---|---|
| 6,140,975 | A | * | 10/2000 | Cohen | H01Q 1/243 343/792.5 |
| 6,809,672 | B2 | * | 10/2004 | Gupta | H03M 3/454 341/143 |
| 7,245,196 | B1 | * | 7/2007 | Baliarda | H01P 1/20381 333/219 |
| 7,453,401 | B2 | * | 11/2008 | Jow | H01Q 1/36 343/700 MS |

(Continued)

*Primary Examiner* — Trinh Dinh
(74) *Attorney, Agent, or Firm* — Koppel, Patrick, Heybl & Philpott

(57) ABSTRACT

A high-gain digitally tuned antenna system comprises a modified swept-back fractal (MSBF) radiator element, with the fractal preferably being a Sierpinski carpet fractal based on a parallelogram. A digital tuning circuit coupled to the radiator comprises an array of inductors which can be selectively connected to form a network which tunes the antenna system to a selected tuning frequency. The system is preferably arranged to selectively connect the inductors in series such that the combined inductances substantially cancel the capacitance of the radiator at a selected tuning frequency. The antenna system is preferably arranged to operate over the 30-88 MHz, 108-174 MHz, and 225-600 MHz bands, with a radiator height of 15" or less.

22 Claims, 7 Drawing Sheets

(56) References Cited

U.S. PATENT DOCUMENTS

| | | | |
|---|---|---|---|
| 7,511,675 B2* | 3/2009 | Puente-Baliarda | H01Q 1/1271 343/713 |
| 7,746,282 B2* | 6/2010 | Lin | H01Q 1/36 343/705 |
| 9,331,389 B2* | 5/2016 | Anguera Pros | H01Q 9/06 343/860 |
| 2002/0101391 A1* | 8/2002 | Kanamaluru | H01Q 1/38 343/915 |
| 2002/0149519 A1* | 10/2002 | Varadan | H01Q 1/36 343/700 MS |
| 2006/0267842 A1* | 11/2006 | Jow | H01Q 1/36 343/700 MS |
| 2007/0126637 A1* | 6/2007 | Habib | H01Q 1/36 343/700 MS |
| 2008/0088903 A1* | 4/2008 | Matteo | H01Q 1/36 359/227 |
| 2011/0254739 A1* | 10/2011 | Dudley | H01Q 1/28 343/700 MS |

* cited by examiner ured RF tuning architecture as might be used with the present
HIGH-GAIN DIGITALLY TUNED ANTENNA SYSTEM WITH MODIFIED SWEPT-BACK FRACTAL (MSBF) BLADE

RELATED APPLICATIONS

This application claims the benefit of provisional patent application No. 61/860,717 to Zhen Biao Lin, Jack J. Q. Lin and Seymour Robin, filed Jul. 31, 2013.

BACKGROUND OF THE INVENTION

Field of the Invention

The present invention relates generally to aircraft antennas.

Description of the Related Art

To enhance their operational capabilities, it is often desirable for modern aircraft to carry one or more antenna systems that operate over wide frequency bands. However, an antenna element may need to be quite tall to provide sufficient signal strength, particularly at lower operating frequencies. This can make the element susceptible to damage, from ground strikes, for example.

SUMMARY OF THE INVENTION

A high-gain digitally tuned antenna system is presented, suitable for use on aircraft, which provides multi-band performance with a low profile radiator.

The present antenna system comprises a modified swept-back fractal (MSBF) radiator element, with the fractal preferably being a Sierpinski carpet fractal based on a parallelogram. A digital tuning circuit coupled to the radiator comprises an array of inductors which can be selectively connected to form a network which tunes the antenna system to a selected tuning frequency. The system is preferably arranged to selectively connect the inductors in series such that the combined inductances substantially cancel the capacitance of the radiator at a selected tuning frequency.

The antenna system is preferably arranged to operate over the 30-88 MHz, 108-174 MHz, and 225-600 MHz bands, with a radiator height of 15" or less.

These and other features, aspects, and advantages of the present invention will become better understood with reference to the following description and claims.

DETAILED DESCRIPTION OF THE INVENTION

Figure 1A:
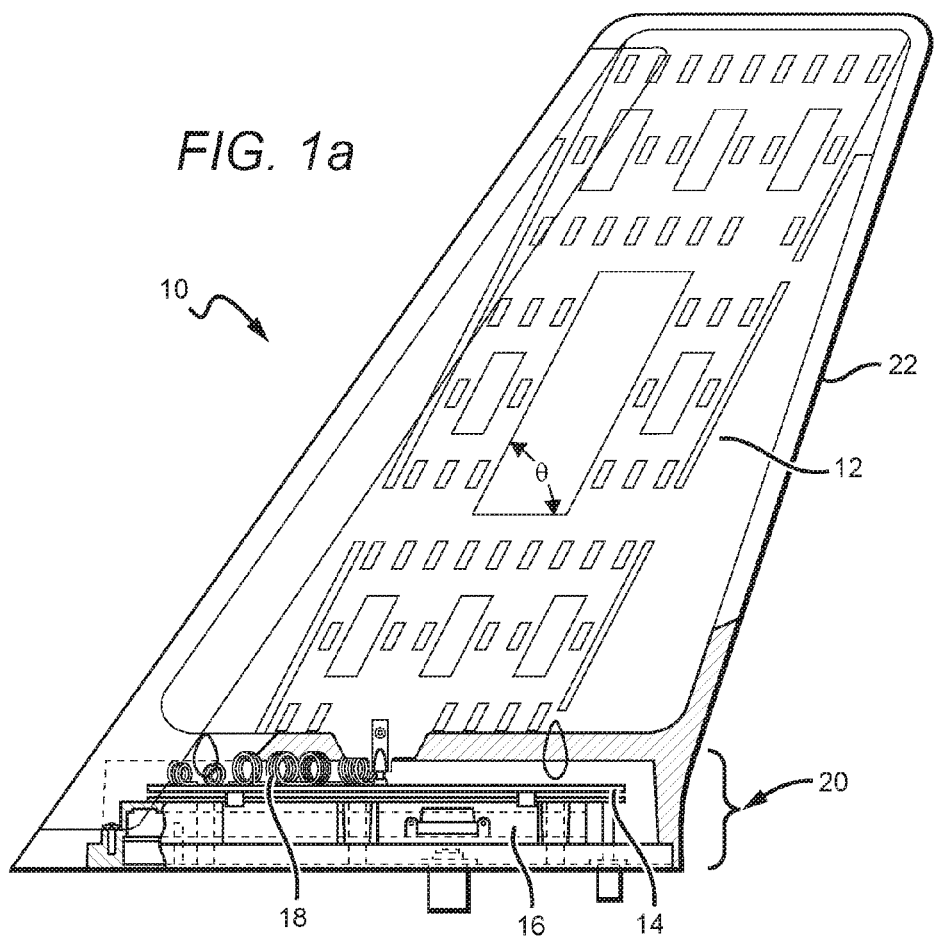
FIGS. 1a and 1b are side and end cutaway views, respectively, of an antenna system per the present invention.
Figures 1B, 4:
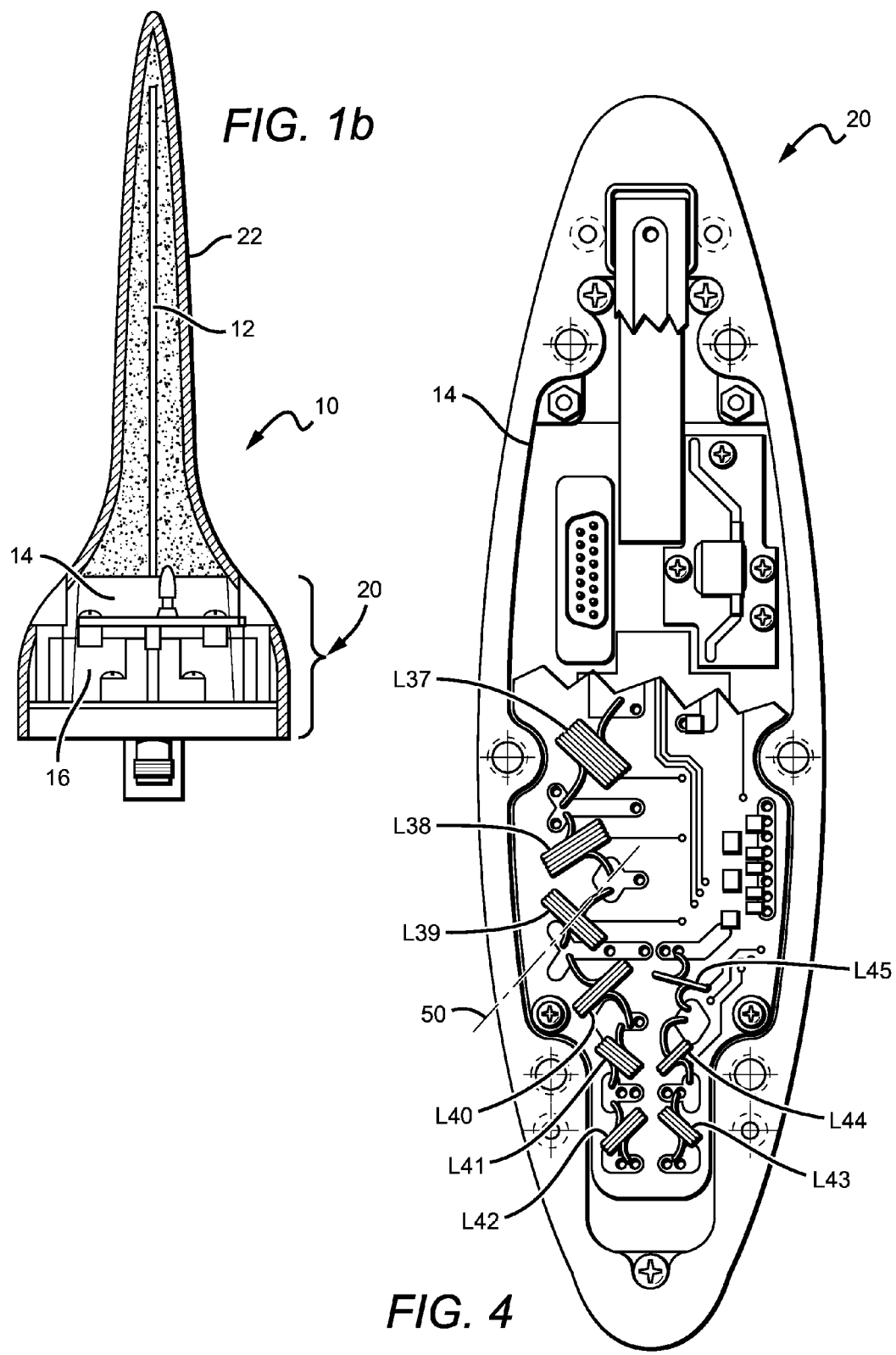
FIG. 4 is a plan view of one possible embodiment of a switching board as might be used with the present antenna system.

A high-gain digitally tuned antenna system is presented, suitable for use on aircraft, which provides multi-band performance with a low profile radiator. An exemplary embodiment of the present antenna system 10 is illustrated in FIGS. 1a and 1b, which show side and end cutaway views, respectively, of the antenna system. The antenna system includes a radiator 12, which comprises a modified swept-back fractal (MSBF) element. Radiator 12 is coupled to a digital tuning circuit which preferably comprises a switching board 14 and a logic control unit 16, with the switching board containing an array of inductors 18 that can be selectively connected to form a network which tunes the antenna system to a selected tuning frequency.

The MSBF element is preferably a Sierpinski carpet fractal, based on a parallelogram and with a vertex angle θ of approximately 60° (±5°). The swept-based design of the MSBF element provides low-drag aerodynamics, excellent side load strength and service life, and the ability to withstand high load pressure and accommodate severe vibration and buffeting environments—making the antenna well-suited for supersonic airborne platforms.

The fractal's self-similarity results in self-similar current distribution, which results in self-similar performance in each band for both VSWR and gain patterns. This enables multiband performance which is non-harmonic and naturally broadband. The present antenna system is preferably arranged to operate over the 30-88 MHz, 108-174 MHz, and 225-600 MHz bands.

Radiator 12 preferably has a height of 15" (or less), or λ/27 at 30 MHz, such that the antenna is an electrically small antenna (ESA). The radiator's low profile serves to minimize antenna-related damage, due to ground strikes, for example. To compensate for the relatively weak signal produced by the short radiator, a digital tuning circuit is employed which significantly improves the antenna's gain, as well as providing excellent selectivity, which filters out adjacent interference (see, e.g., FIGS. 3b and 6). The digital tuning circuit is described in detail below.

Conventional tunable aircraft antennas are typically composed of at least two separate units; for example, an antenna system may include a blade unit containing the radiator along with a tuning and switching circuit, and a logic control unit, with a long multi-wire cable connecting the two units. This arrangement can make it difficult to replace the failed devices in the blade unit, and to perform repair and replace efforts in the field.

To address this problem, the present antenna system preferably houses the entire digital tuning circuit (14, 16) within a base 20 to which radiator 12 is mounted. Preferably, the switching board 14, the logic control unit 16, and a power supply (not shown) for the digital tuning circuit are enclosed with base 20. Radiator 12 is preferably contained within an aerodynamic composite blade 22 which is mounted to base 20, thus providing a complete self-contained antenna system having a height of about 15.5". When so arranged, replacement or repair in the field is accomplished by simply replacing the entire blade/base unit. This also simplifies the production of the present antenna system.

Figure 2:
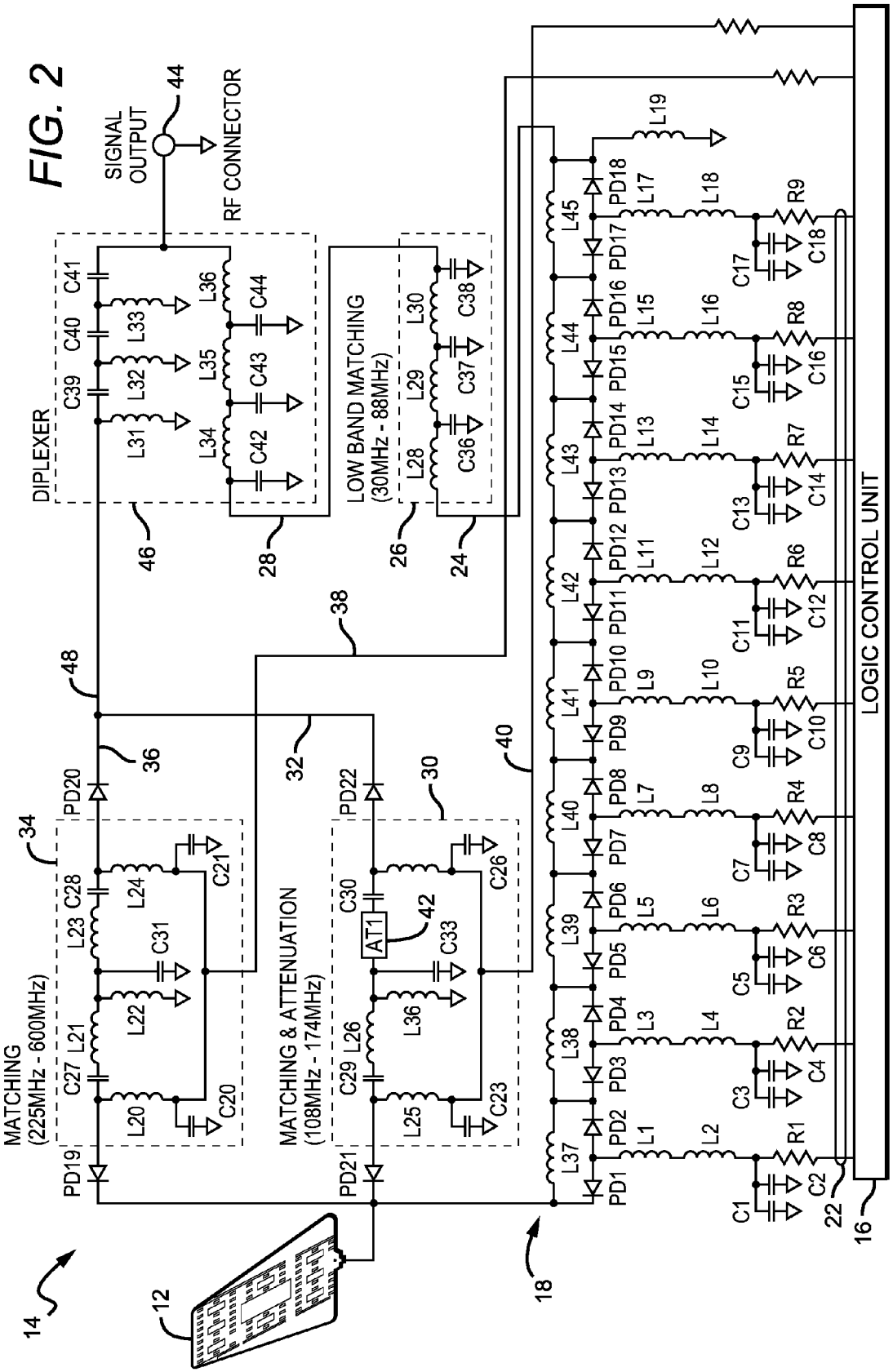
FIG. 2 is a block/schematic diagram of a digital tuning circuit as might be used with the present antenna system.

The digital tuning circuit is preferably arranged to selectively connect inductors in series such that the combined inductances substantially cancel the capacitance of the radiator at a selected tuning frequency. One possible schematic diagram for a digital tuning circuit in accordance with the present antenna system is shown in FIG. 2. Switching board 14 includes an array of inductors 18 (here comprising inductors L37-L45) that can be selectively connected to form a network which is coupled to radiator 12 and tunes the antenna system to a selected tuning frequency.

Inductors 18 are preferably connected into a desired network using respective switches. In a preferred embodiment, each switch is implemented with a pair of switching diodes (PD1-PD18), opposed pairs of which are connected in parallel across respective inductors, such that each inductor can be selectively connected in series, or bypassed, in response to a control signal applied to the junction between the opposed pair of diodes. For example, inductor L37 is connected in series with the output of radiator 12 by applying an appropriate control signal to the junction of PD1 and PD2. Diodes PD1-PD18 are preferably PIN diodes. The control signals (22) are provided by logic control unit 16, which is preferably arranged to generate control signals 22 as needed to substantially cancel the capacitance of radiator 12 at a selected tuning frequency. Additional components such as inductors L1-L18 and capacitors C1-C18 may be used to condition control signals 22 as needed to properly operate the switches connected across inductors L37-L45, and to isolate logic control unit 16 from the RF signals present on switching board 14.

Tunable inductor array 18 is preferably arranged to produce an output 24 for signals in the 30-88 MHz band. An impedance matching circuit 26 is preferably coupled to the output 24 of the inductance network to provide an output 28 with a standard 50Ω impedance.

Digital tuning circuit 14 suitably includes a second impedance matching circuit 30 coupled to radiator 12 and arranged to produce an output 32 for signals in the 108-174 MHz band, and a third impedance matching circuit 34 coupled to the radiator and arranged to produce an output 36 for signals in the 225-600 MHz band. As shown in FIG. 2, pairs of diodes PD19/PD20 and PD21/PD22 can be connected across third impedance matching circuit 34 and second impedance matching circuit 30, respectively, and used to couple circuit 34 and/or circuit 30 to radiator 12 in response to control signals 38 and 40, respectively.

Note that the components shown within the impedance matching circuits are merely exemplary. More or fewer components might be included as required by a particular application. For example, an attenuation circuit 42 might be included within second impedance matching circuit 30; this might be necessary to achieve a desired output impedance (such as 50Ω). The attenuation will lower the antenna's gain, but significantly increase VWSR. Since second impedance matching circuit 30 is for use with a higher frequency band such as 108-174 MHz, the short height of the radiator should not adversely affect gain, and thus an attenuation circuit should not adversely affect performance.

A multiplexer is preferably coupled to the outputs of each of impedance matching circuits 26, 30 and 34, and arranged to produce the antenna system's final output signal 44. Here, the multiplexer is preferably a diplexer 46 which receives output 28 from first impedance matching circuit 26, along with a signal 48 produced by connecting together the outputs 32 and 36 from impedance matching circuits 30 and 34. Diplexer 46 suitably comprises a high pass filter (here comprised of capacitors C39-C41 and inductors L31-L33) for filtering the outputs from second and third impedance matching circuits 30 and 34, and a low pass filter (here comprised of capacitors C42-C44 and inductors L34-L36) for filtering the output from first impedance matching circuit 26.

As noted above, digital tuning circuit 14 is preferably arranged to generate control signals 22 as needed to substantially cancel the capacitance of radiator 12 at a selected tuning frequency. When the proper amount of inductive reactance is coupled to the output of radiator 12 with its high capacitive reactance, the total reactance can be driven to near zero. This arrangement can provide an increase in gain of more than 13 dB compared with a passive MSBF of the same size.

Figure 3A:
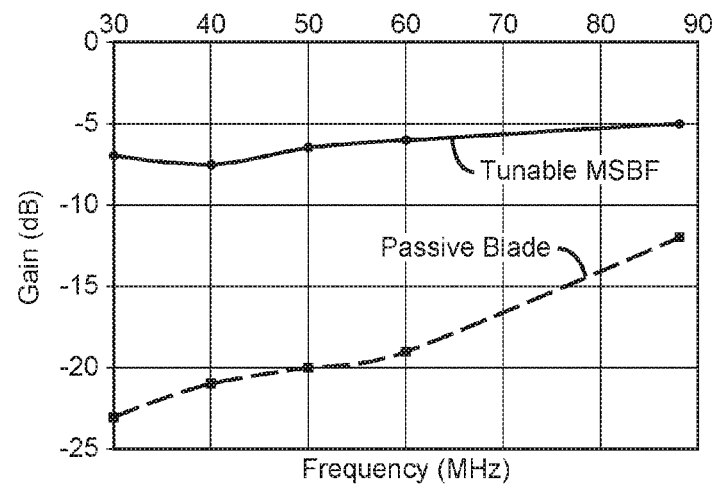
FIG. 3a is a graph plotting gain vs. frequency for a conventional blade and a tunable MSBF blade as might be used with the present antenna system.
Figure 3B:
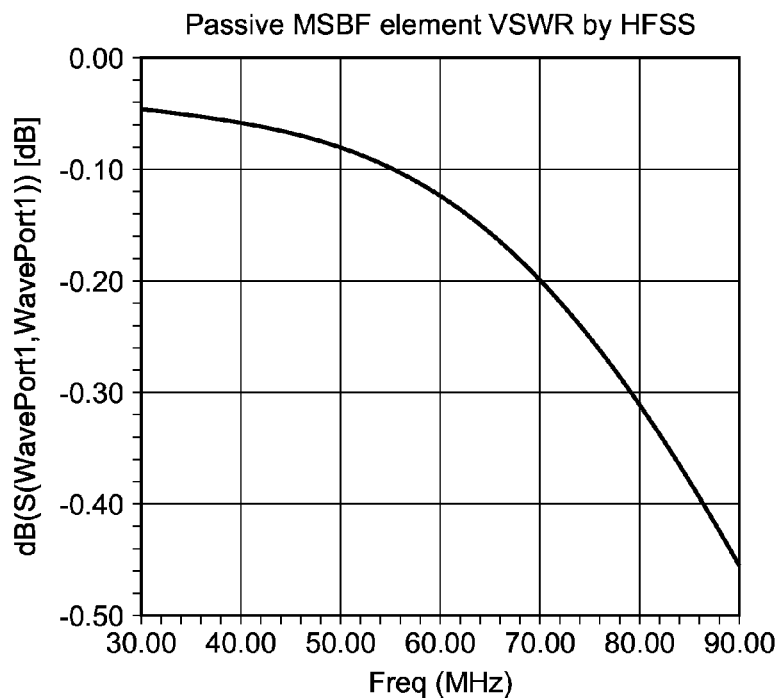
FIG. 3b is a graph plotting VSWR vs. frequency for a passive MSBF element and a MSBF element tuned as described herein.
Figure 3B:
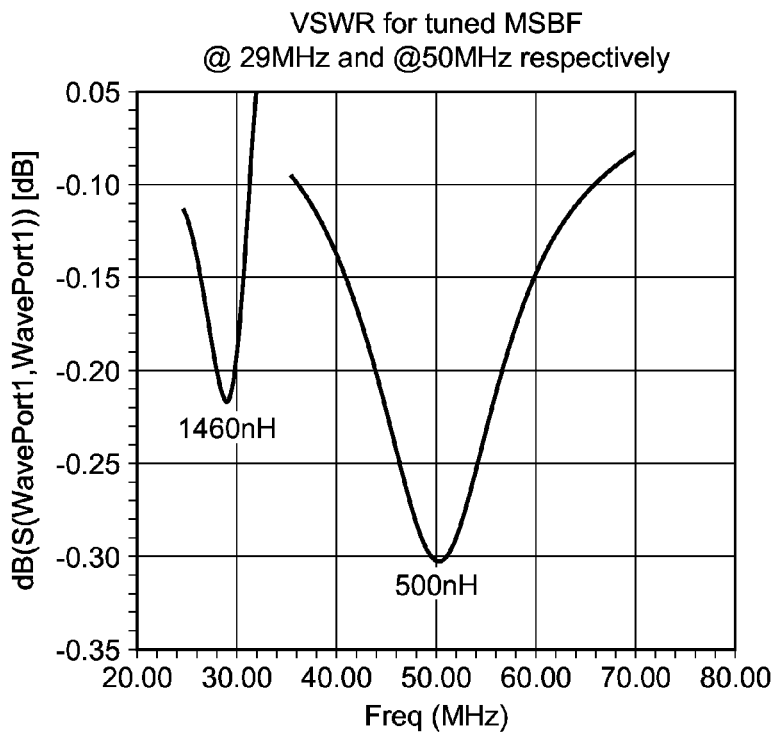

The antenna system's gain and VSWR characteristics over the 30-88 MHz band are greatly improved when using a digital tuning circuit as described herein. This is illustrated in FIGS. 3a and 3b. FIG. 3a compares gain performance for the present tunable MSBF antenna system versus that of a passive blade, and FIG. 3b shows VSWR performance for a passive MSBF element versus that of the same MSBF element, but tuned as described above.

Fast switching times may also be important for some applications. A tuning time of less than 32 μs has been demonstrated for an antenna system as described herein.

Digital tuning circuit 14 preferably resides on a printed circuit board (PCB), with the inductors L37-L45 preferably being air coils. This is illustrated in FIG. 4, which shows a plan view of one possible embodiment of a PCB for digital tuning circuit 14, housed within antenna base 20. Nine air coil-type inductors are shown (L37-L45) in this example.

Each air coil-type inductor has a corresponding axis through its center; for example, an axis 50 is shown through the center of inductor L39. The axes through the centers of the air coils are preferably parallel to the PCB, with each axis being at an angle of approximately 90° with respect to the axis of an adjacent air coil to reduce coupling. Conventional spiral inductors can induce eddy currents in the PCB on which they are located. The eddy currents increase the loss resistance in the switching inductance, which results in a significant degradation of the radiation efficiency, especially in the low end of the VHF band for a tunable antenna. Using air coil-type inductors as described herein serves to significantly minimize such eddy currents and reduce the loss resistance in the switching circuit that might otherwise occur.

Figure 5:
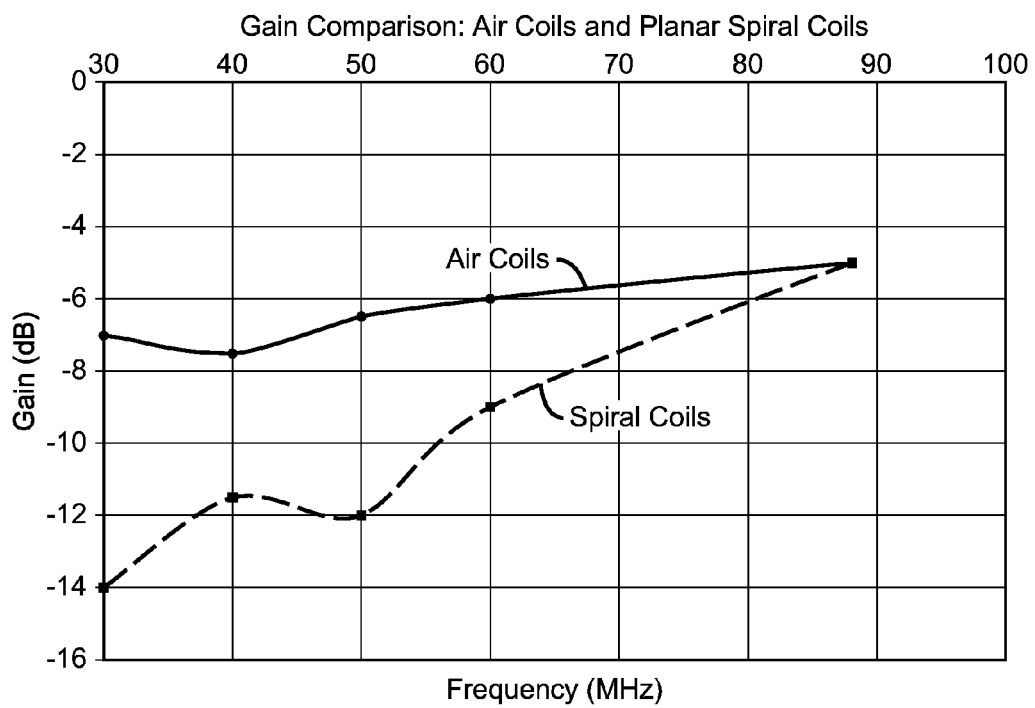
FIG. 5 is a graph plotting gain vs. frequency for a tuning circuit employing spiral inductors and a tuning circuit employing an air coil array.

This is particularly important for an antenna system as described herein. As noted above, the present antenna system preferably has a radiator with a height of about 15". Such a short antenna appears to have a very high Q, with a very low radiation resistance (typically about 0.7Ω) and a very high capacitance reactance (typically −250Ω). An array of air coil-type inductors as described above provides a fast switching inductor array with very low loss resistance, and thus is well-suited for use with the present tunable antenna. This is illustrated in FIG. 5, which depicts the difference in achievable gain for an air coil array versus conventional spiral inductors when operating in the 30-88 MHz band.

As shown in FIG. 4, the air coil-type inductors can have different numbers of windings, such that their respective inductances progressively vary from a low value to a high value. For example, the inductances may be arranged in a binary progression, with the smallest inductor having an inductance L, the second inductor having an inductance 2L, the third an inductance 4L, and so on.

Figure 6:
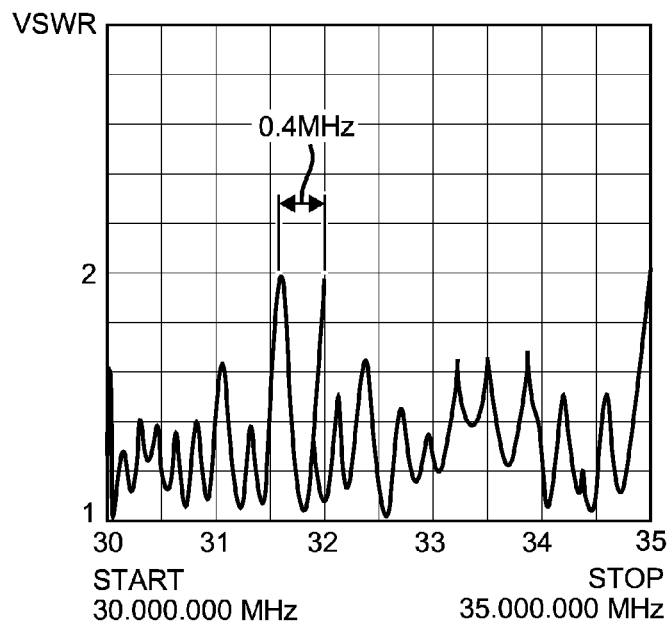
FIG. 6 is a graph which demonstrates typical bandwidth performance for an antenna system per the present invention.

In data communications, the bit error rate is dependent on the ratio of bit energy to noise density. The bit energy is related to receiver gain, while the noise density is related to reception selectivity. Thus, the bit error rate in data communications depends on both gain and selectivity. Because a passive antenna provides almost no attenuation of interfering signals, its selectivity is very poor. However, due to the tunability of the present antenna system, high selectivity can be provided. This is illustrated in FIG. 6, which demonstrates a bandwidth of 0.4 MHz at 2:1 VSWR at a frequency of 31.8 MHz for an antenna system as described herein. This provides an excellent antenna selectivity Q (given by center frequency/bandwidth) of 31.8 MHz/0.4 MHz=80.

The present MSBF radiator also provides excellent performance in the UHF band (225-600 MHz). According to the Antenna Field Equivalence Principle, the aperture field may be replaced by equivalent magnetic surface currents. The radiation vector from an antenna aperture can be obtained by Fourier transforms of the current densities:

$$F(\theta,\phi) = \int_{V'} J(r') e^{jkr'} dV'$$

where $F(\theta, \phi)$ is the radiation vector at observation direction $(\theta,\phi)$, J is current density, $k=2\pi/\lambda$, and v is the volume over which the current densities are non-zero. A key to improving antenna radiation performance is to get higher current densities $J(r')$ spread on all surfaces of the swept-back blade. This is facilitated by the MSBF design of the radiator for the present antenna system.

Figure 7:
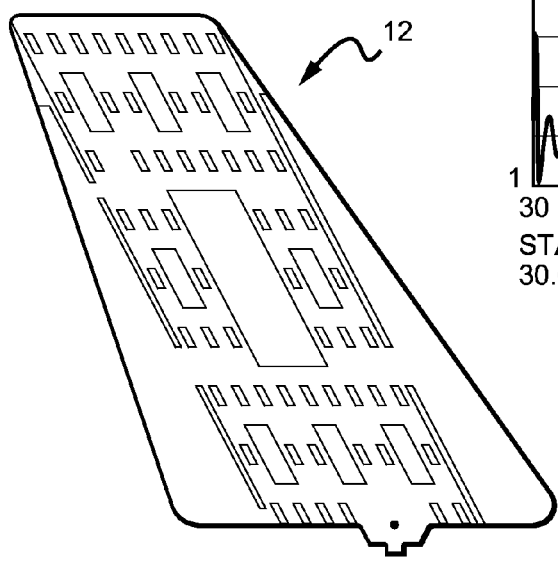
FIG. 7 is a side view of an MSBF radiator as might be used with the present antenna system.

An exemplary embodiment of the radiator, shown in FIG. 7, can be seen as a special Sierpinski carpet fractal in the UHF band. The initializer is a single parallelogram with a vertex angle of 60°. The transformation which creates the Sierpinski carpet fractal consists of subtracting from the center of each parallelogram another parallelogram having sides equal to one-third the sides of the original parallelogram. As a result, a new geometry is created which is now considered to be the fractal generator—also called "iteration 1)". Iteration 2 is obtained by reproducing the geometry of iteration 1 in reduced scale, and iteration 3 mimics iteration 1 at an even more reduced scale; this three iteration geometry is shown in FIG. 7. The mother/son/grandson-type relationship between iterations 1, 2 and 3 enable the present antenna system to provide similar performance for the low, mid, and high bands, respectively.

The present MSBF radiator design has the advantage of providing natural multiband operation from 108 MHz to 512 Mhz. This multiband behavior is due to the self-similarity of the structure provided by the fractal design as discussed above. This fractal geometry produces an improvement in current density distribution on the radiator surface. As antenna gain is partially dependent on the surface current densities of the radiator, it can be concluded that the improved current density distribution provided by the invented MSBF radiator also results in improved gain performance.

Figure 8:
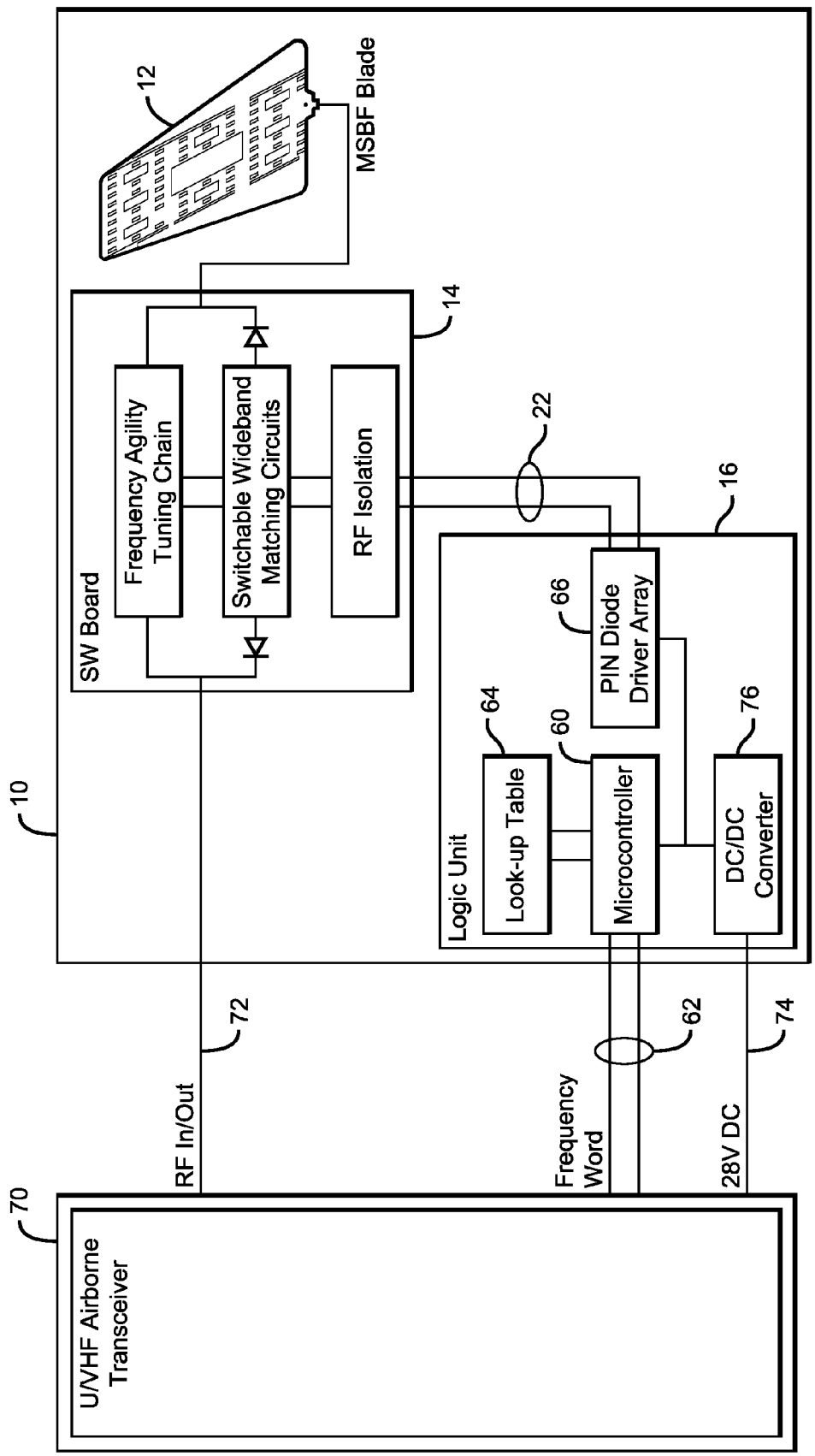
FIG. 8 is a block diagram illustrating a typical interface between the present antenna system and a UHF/VHF transceiver.

The operation of the present antenna system is further illustrated in FIG. 8. As before, antenna system 10 includes an MSBF radiator 12, switching board 14 and logic control unit 16. Logic control unit 16 preferably includes a microcontroller 60, which receives a digital frequency word 62 representing a desired tuning frequency. The logic control unit preferably also includes a lookup table 64 and a PIN diode driver array 66. Logic control unit 16 is arranged to receive the desired frequency word, apply it to the input of the lookup table, and use the output of the lookup table to operate PIN diode driver array 66 such that it generates the control signals 22 needed to tune the antenna system to the desired frequency. Antenna system 10 would typically interface to a UHF/VHF airborne transceiver 70, which is arranged to receive the tuned RF signal or provide the RF signal to be transmitted (72), and to provide the frequency word 62 to logic control unit 16. Transceiver 70 might also provide a supply voltage 74 (such as 28V DC) to logic control unit 16; the logic control unit could also include a power converter such as a DC/DC converter 76 which receives the supply voltage and generates the power forms needed by the circuitry within antenna system 10.

Figure 9:
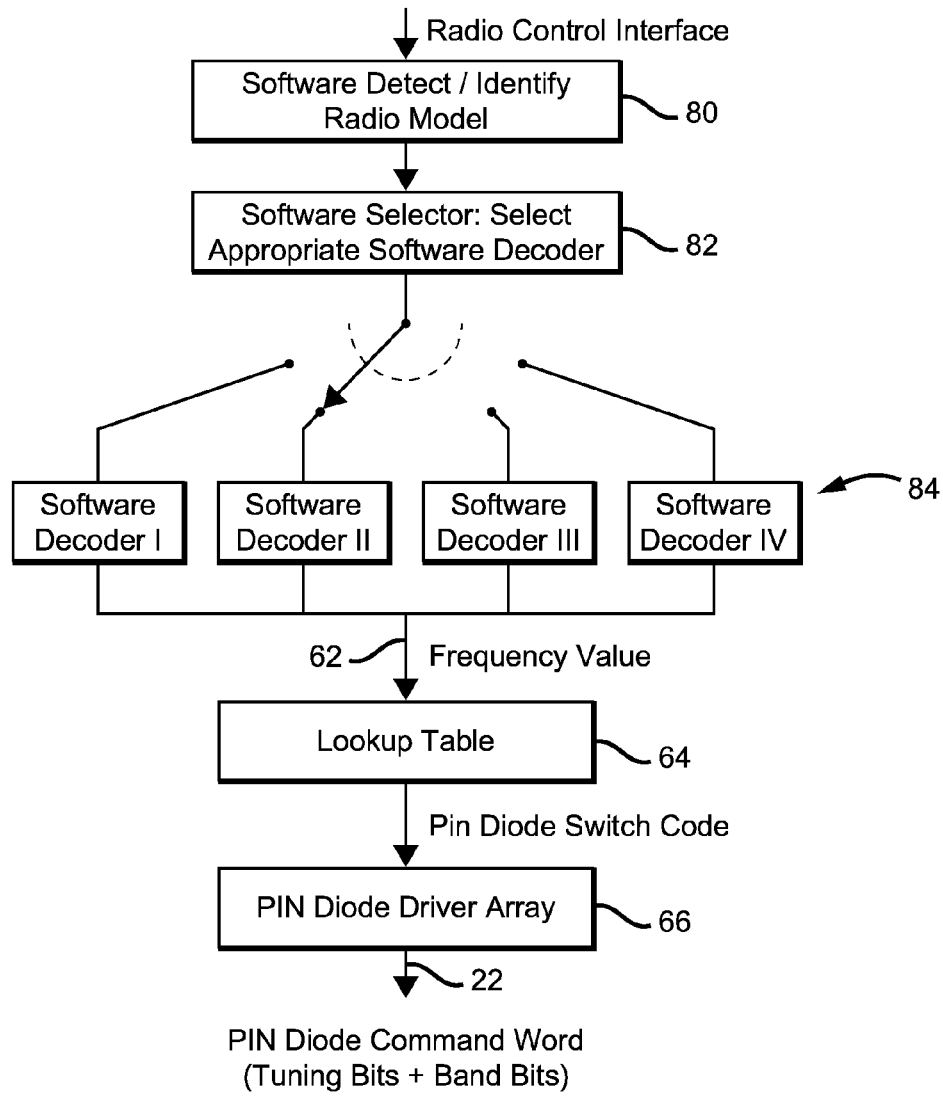
FIG. 9 is a block diagram illustrating a software-defined RF tuning architecture as might be used with the present antenna system.

The present antenna system may further comprise a software-defined RF tuning architecture; an example is shown in FIG. 9. This arrangement enables the system to be compatible with multiple existing military or commercial multiband and multi-mission radio systems, such as the Raytheon ARC231, Collins ARC 210, Rohde & Schwarz M3AR6000 and/or Thales MMAR systems. In a typical embodiment, a module 80 is employed to detect/identify the model of the radio system to be connected to the antenna system. A software selector module 82 then couples the identified radio to an appropriate software decoder 84, which is arranged to decode the commands received from the identified radio and generate the frequency word 62 to the logic control unit 16 accordingly.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A high-gain digitally tuned antenna system suitable for use on aircraft, comprising:
   a radiator, said radiator comprising a modified swept-back fractal (MSBF) element, wherein said fractal element has a Sierpinski carpet fractal based on a parallelogram having a vertex angle of between 55° and 65°;
   a digital tuning circuit coupled to said radiator, said digital tuning circuit comprising an array of inductors which can be selectively connected to form a network which tunes said antenna system to a selected tuning frequency.

2. The antenna system of claim 1, wherein said system is arranged to operate over the 30-88 MHz band, the 108-174 MHz band, and the 225-600 MHz band.

3. The antenna system of claim 1, wherein said system is arranged to selectively connect said inductors in series such that the combined inductances substantially cancel the capacitance of said radiator at said selected tuning frequency.

4. The antenna system of claim 1, wherein said radiator has a height of 15" or less.

5. The antenna system of claim 1, wherein said digital tuning circuit is on a printed circuit board (PCB) and said array of inductors comprise air coils, the axes through the centers of said air coils being parallel to said PCB.

6. The antenna system of claim 1, wherein said radiator is mounted to a base, said digital tuning circuit housed within said base.

7. The antenna system of claim 1, further comprising a software-defined RF tuning architecture arranged to selectively couple one of a plurality of radio systems to said antenna system.

8. A high-gain digitally tuned antenna system suitable for use on aircraft, comprising:
- a radiator, said radiator comprising a modified Sierpinski swept-back fractal (MSBF) element based on a parallelogram with a vertex angle of 55°-65°; and
- a digital tuning circuit coupled to said radiator, said digital tuning circuit comprising an array of inductors which can be selectively connected in series to tune said antenna system to a selected tuning frequency in the 30-88 MHz band;
- said radiator having a height of 15" or less.

9. The antenna system of claim 8, wherein said system is further arranged to transmit and receive over the 108-174 MHz band and the 225-600 MHz band.

10. The antenna system of claim 9, wherein said digital tuning circuit further comprises:
- a first impedance matching circuit coupled to the output of said digital tuning circuit and arranged to produce an output for signals in said 30-88 MHz band;
- a second impedance matching circuit coupled to said radiator and arranged to produce an output for signals in said 108-174 MHz band;
- a third impedance matching circuit coupled to said radiator and arranged to produce an output for signals in said 225-600 MHz band; and
- a multiplexer coupled to the outputs of each of said impedance matching circuits and arranged to produce said antenna system's output signal.

11. The antenna system of claim 10, wherein said multiplexer is a diplexer.

12. The antenna system of claim 11, wherein said diplexer comprises a low pass filter coupled to the output of said first impedance matching circuit and a high pass filter coupled to the outputs of said second and third impedance matching circuits.

13. The antenna system of claim 10, wherein said second impedance matching circuit further comprises an attenuator.

14. The antenna system of claim 8, wherein said system is arranged to selectively connect said inductors in series such that the combined inductances substantially cancel the capacitance of said radiator at said selected tuning frequency.

15. The antenna system of claim 8, wherein said digital tuning circuit further comprises diodes arranged across each of said inductors to enable selection thereof.

16. The antenna system of claim 15, wherein said diodes are switching diodes, opposed pairs of which are connected in parallel with respective inductors, such that each inductor can be selectively connected in series or bypassed in response to a control signal applied to the junction between the opposed pair of diodes connected in parallel with said inductor.

17. The antenna system of claim 16, wherein said diodes are PIN diodes.

18. The antenna system of claim 16, said digital tuning circuit comprising:
- a switching board which includes said inductors and said switching diodes; and
- a logic control unit which receives a frequency word representing a desired tuning frequency and which produces said control signals to said switching diodes.

19. The antenna system of claim 18, wherein said radiator is mounted to a base, and said digital tuning circuit housed within said base.

20. The antenna system of claim 19, wherein said logic control unit further comprises a DC/DC converter for operating said logic control unit, said DC/DC converter housed within said base.

21. The antenna system of claim 8, further comprising a software-defined RF tuning architecture arranged to selectively couple one of a plurality of radio systems to said antenna system.

22. The antenna system of claim 8, wherein said digital tuning circuit is on a printed circuit board (PCB) and said array of inductors comprise air coils, the axes through the centers of said air coils being parallel to said PCB, each axis being at an angle of approximately 90° with respect to the axis of an adjacent air coil.

* * * * *